United States Patent
Uchida et al.

(10) Patent No.: US 8,158,505 B2
(45) Date of Patent: Apr. 17, 2012

(54) METHOD FOR MANUFACTURING A SEMICONDUCTOR DEVICE, SEMICONDUCTOR CHIP AND SEMICONDUCTOR WAFER

(75) Inventors: Shinichi Uchida, Kanagawa (JP); Yoshitsugu Kawashima, Kanagawa (JP); Hiroshi Ise, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 89 days.

(21) Appl. No.: 12/801,215

(22) Filed: May 27, 2010

(65) Prior Publication Data
US 2010/0320611 A1 Dec. 23, 2010

(30) Foreign Application Priority Data
Jun. 17, 2009 (JP) ................................. 2009-144647

(51) Int. Cl.
- H01L 21/50 (2006.01)
- H01L 21/48 (2006.01)
- H01L 21/44 (2006.01)
- H01L 21/78 (2006.01)
- H01L 21/46 (2006.01)

(52) U.S. Cl. ........ 438/598; 438/113; 438/460; 438/462; 438/618; 438/622; 257/E21.599; 257/E21.575; 257/E21.582

(58) Field of Classification Search ........... 257/E21.599, 257/E21.575, E21.582
See application file for complete search history.

(56) References Cited

U.S. PATENT DOCUMENTS

| 5,897,193 A | 4/1999 | Nishino |
| 7,723,826 B2 * | 5/2010 | Miyata et al. ................ 257/620 |
| 7,999,386 B2 * | 8/2011 | Uchida et al. ................ 257/759 |
| 2004/0145028 A1 | 7/2004 | Matsumoto et al. |
| 2005/0186708 A1 * | 8/2005 | Yamada ........................ 438/113 |

FOREIGN PATENT DOCUMENTS

| JP | 5-29413 | 2/1993 |
| JP | 8-181330 | 7/1996 |
| JP | 2000-286316 | 10/2000 |
| JP | 2004-235357 | 8/2004 |

* cited by examiner

*Primary Examiner* — Mohsen Ahmadi
(74) *Attorney, Agent, or Firm* — McGinn IP Law Group, PLLC

(57) ABSTRACT

A method for manufacturing a semiconductor device includes forming a semiconductor wafer including a plurality of interconnect layers, the semiconductor wafer including: a plurality of chip-composing portions; a dicing region separating the chip-composing portions from each other; and a plurality of inter-chip interconnects electrically connecting adjacent ones of the chip-composing portions and formed in one of the interconnect layers and in the dicing region; a dummy metal pattern comprising a plurality of dummy metals, the dummy metal pattern being formed in at least one of the interconnect layers over or below the inter-chip interconnects only in an area corresponded to a region where the inter-chip interconnects are arranged and corresponded to a region therearound; and forming semiconductor chips by dicing the dicing region so as to divide the chip-composing portions.

11 Claims, 13 Drawing Sheets

METHOD FOR MANUFACTURING A SEMICONDUCTOR DEVICE, SEMICONDUCTOR CHIP AND SEMICONDUCTOR WAFER

This application is based on Japanese patent application No. 2009-144647 the content of which is incorporated hereinto by reference.

BACKGROUND

1. Technical Field

The present invention relates to a method for manufacturing a semiconductor device, a semiconductor chip, and a semiconductor wafer.

2. Related Art

Semiconductor chip is generally manufactured by forming a plurality of chip-composing portions, each of which later configures a semiconductor chip (simply referred to as "chip", hereinafter) on a single semiconductor wafer (simply referred to as "wafer", hereinafter), and then by cutting (dicing) the wafer along dicing region using a dicer, so as to separate the individual chip-composing portions from each other.

Inter-chip interconnects which connect adjacent ones of the chip-composing portions sequentially with each other, may occasionally be provided, typically for the purpose of inspecting en bloc the plurality of chip-composing portions in a single wafer, in a step preceding the separation of the individual chip-composing portions. Formation of the inter-chip interconnects which connect the chip-composing portions are described in Japanese Laid-Open Patent Publication Nos. 2000-286316, H08-181330, and H05-29413, for example.

The inter-chip interconnects between adjacent ones of the chip-composing portions are cut by dicing using a dicer. In the process of dicing, chipping may occur in the wafer.

Japanese Laid-Open Patent Publication No. 2004-235357 discloses a technique of arranging rectangular dummy patterns arrayed in a lattice pattern over the entire portion of the dicing region, for the purpose of suppressing spreading of the chipping in the wafer in the process of dicing, although the inter-chip interconnects are not mentioned. This publication relates to the dummy patterns disposed for the purpose of improving in-plane uniformity of CMP (chemical mechanical polishing). The dummy pattern may, therefore, be supposedly composed of copper (Cu).

SUMMARY

Areas having the inter-chip interconnects arranged therein and areas therearound are likely to cause chipping, mainly because the inter-chip interconnects and the constituent therearound may be curled up, due to entrainment of the inter-chip interconnect under the dicing blade of the dicer.

Placement of the dummy patterns over the entire portion of the dicing region, such as described in Japanese Laid-Open Patent Publication No. 2004-235357 may, however, make the dicing difficult due to presence of the dummy patterns.

As may be understood from the above, it has been difficult to achieve both of suppression of degradation in the readiness of dicing, and suppression of spreading of chipping in the semiconductor wafer in the process of dicing, at the same time.

In one embodiment, there is provided a method for manufacturing a semiconductor device which includes:

forming a semiconductor wafer comprising a plurality of interconnect layers, the semiconductor wafer including:

a plurality of chip-composing portions;

a dicing region separating the chip-composing portions from each other; and a plurality of inter-chip interconnects electrically connecting adjacent ones of the chip-composing portions and formed in one of the interconnect layers and in the dicing region;

a dummy metal pattern comprising a plurality of dummy metals, the dummy metal pattern being formed in at least one of the interconnect layers over or below the inter-chip interconnects only in an area corresponded to a region where the inter-chip interconnects are arranged and corresponded to a region therearound; and forming semiconductor chips by dicing the dicing region so as to divide the chip-composing portions.

According to the method for manufacturing a semiconductor device, since a dummy metal pattern composed of a plurality of dummy metals is formed in at least one of the interconnect layers over or below the inter-chip interconnects only in an area corresponded to a region where the inter-chip interconnects are arranged, and corresponded to a region therearound, in other words, since the dummy metal pattern is arranged at a position where the chipping is likely to occur in the process of dicing, so that the chipping may successfully be suppressed from spreading in the process of dicing. This is because any crack induced by the chipping may run against the dummy metal, and may be prevented from propagating. Also since the dummy metal pattern is formed in at least one of the interconnect layers over or below the inter-chip interconnects only in an area corresponded to a region where the inter-chip interconnects are arranged, and corresponded to a region therearound, so that the readiness in dicing may be prevented from degrading due to presence per se of the dummy metals, and thereby the semiconductor wafer may readily be diced, unlike the case where the dummy metal pattern is formed also in the area other than the above-described area. As has been described in the above, both of suppression of degradation of the readiness in dicing, and suppression of spreading of chipping of the semiconductor wafer in the process of dicing, may be achieved at the same time.

In another embodiment, there is also provided a semiconductor chip which includes:

a semiconductor substrate; and a plurality of interconnect layers formed over the semiconductor substrate, wherein the semiconductor chip has an end portion of an interconnect, contained in any one of the interconnect layers, exposed to the end face thereof, and the semiconductor chip has a dummy metal pattern composed of a plurality of dummy metals, which is formed in at least one of the interconnect layers over or below the exposed interconnect only in an area corresponded to a region where the exposed interconnect is arranged, and corresponded to a region therearound.

In another embodiment, there is still also provided a semiconductor wafer which includes:

a plurality of chip-composing portions;

a dicing region separating the chip-composing portions from each other; and a plurality of inter-chip interconnects electrically connecting adjacent ones of the chip-composing portions and formed in one of the interconnect layers and in the dicing region;

a dummy metal pattern comprising a plurality of dummy metals, the dummy metal pattern being formed in at least one of the interconnect layers over or below the inter-chip interconnects only in an area corresponded to a region where the inter-chip interconnects are arranged and corresponded to a region therearound.

According to the present invention, both of suppression of degradation of the readiness in dicing, and suppression of spreading of chipping of the semiconductor wafer in the process of dicing, may be achieved at the same time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
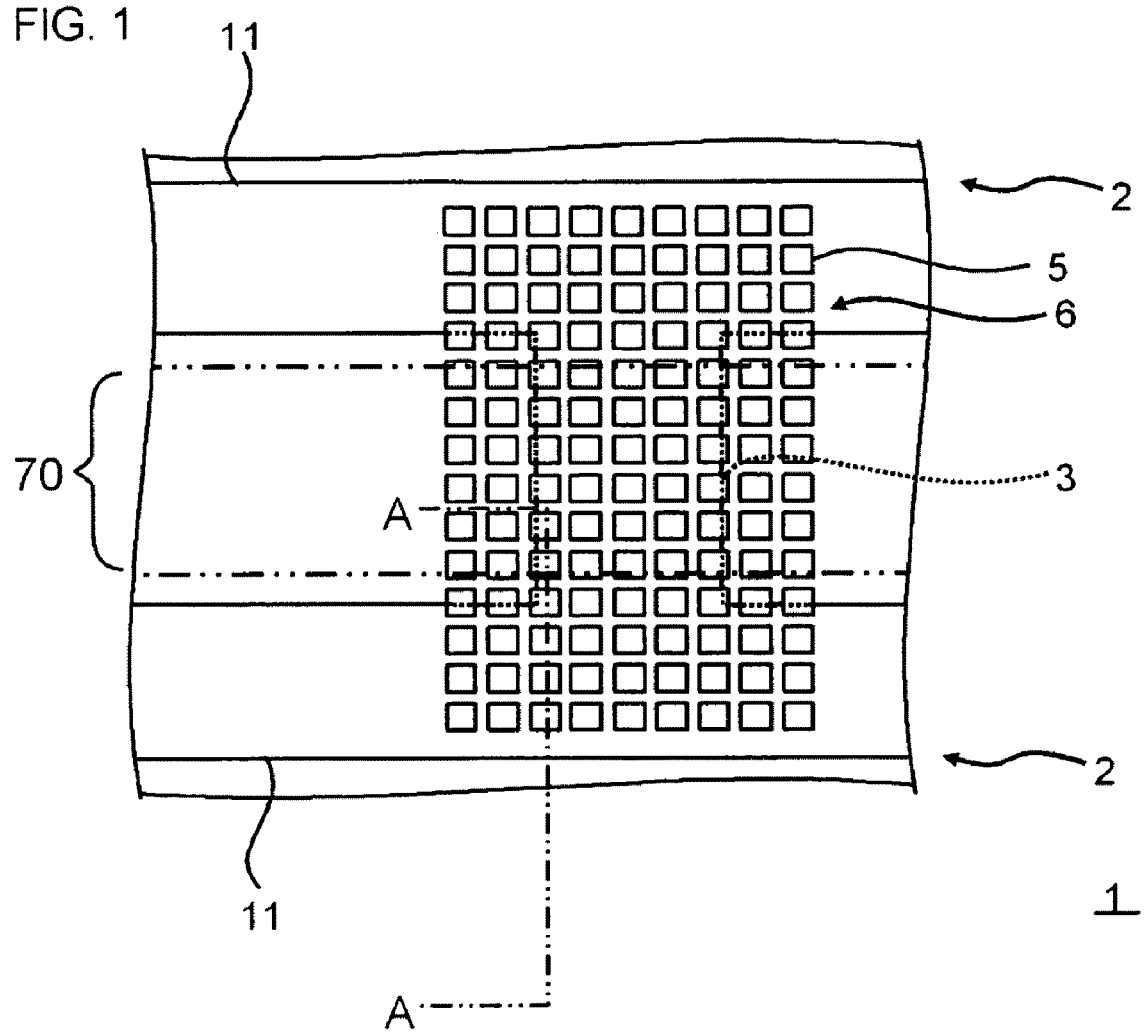
FIG. 1 is a drawing illustrating an essential portion of a semiconductor wafer according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and relevant explanations will not always necessarily be repeated.

First Embodiment

Figure 2:
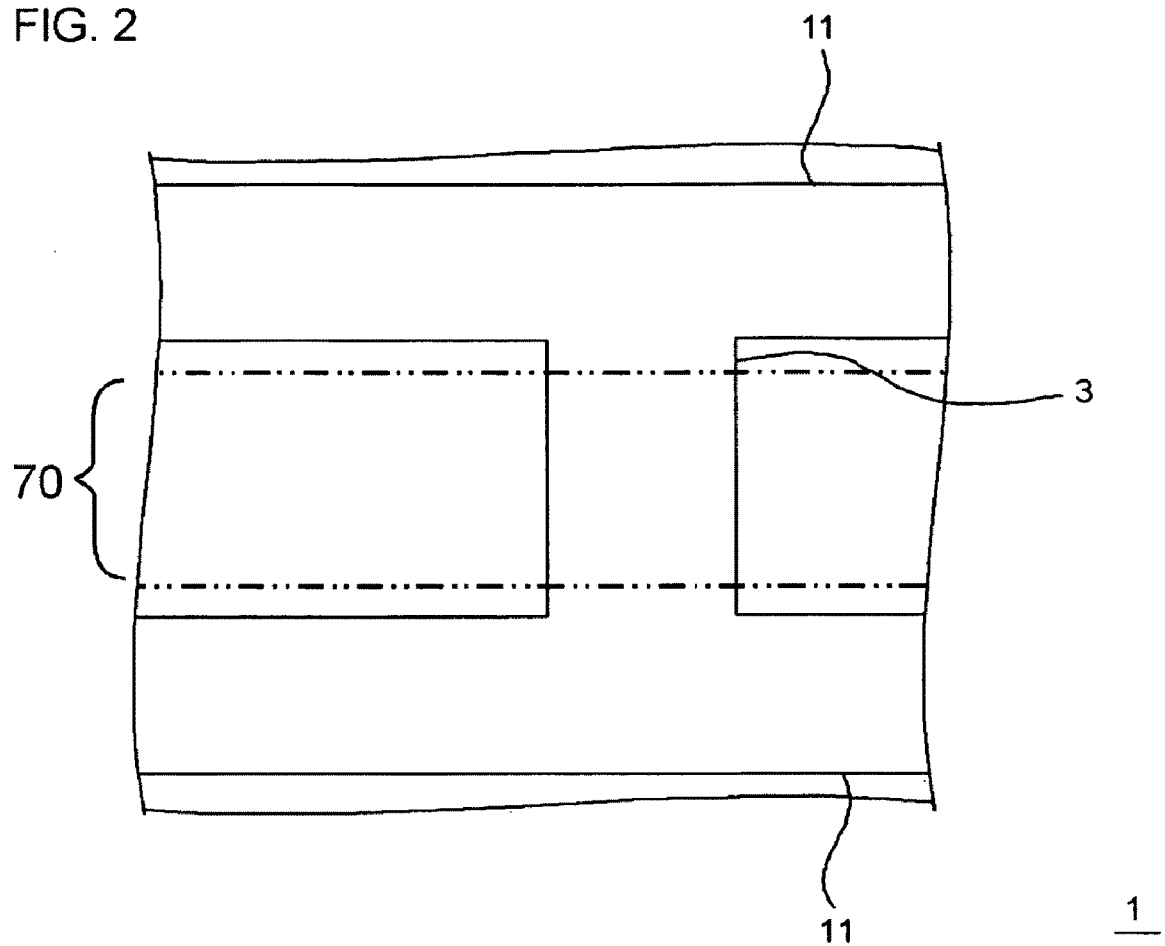
FIG. 2 is a drawing illustrating the essential portion of the semiconductor wafer according to the first embodiment, from which a dummy metal pattern is removed.
Figure 3:
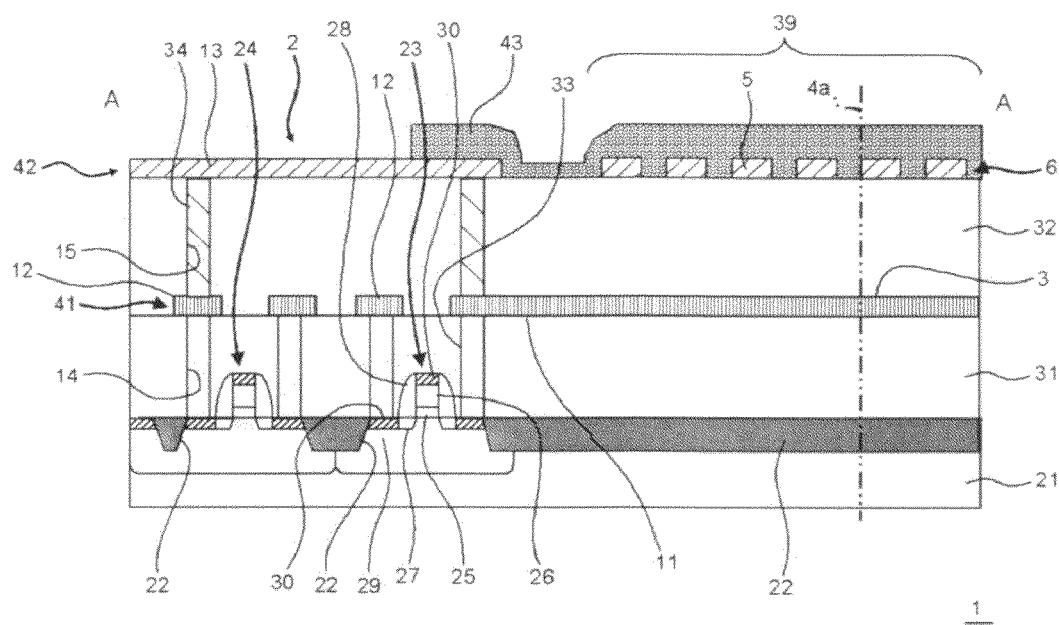
FIG. 3 is a sectional view illustrating the essential portion of the semiconductor wafer according to the first embodiment.
Figure 4:
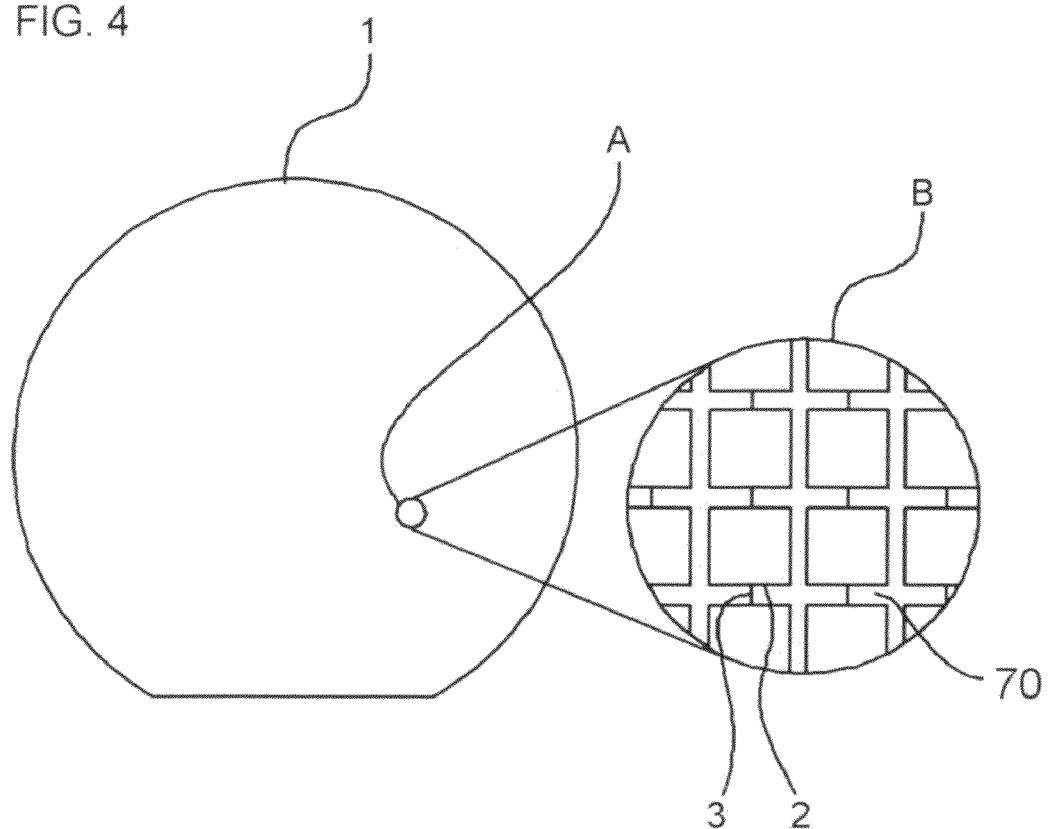
FIG. 4 is a plan view of the semiconductor wafer according to the first embodiment.
Figure 5:
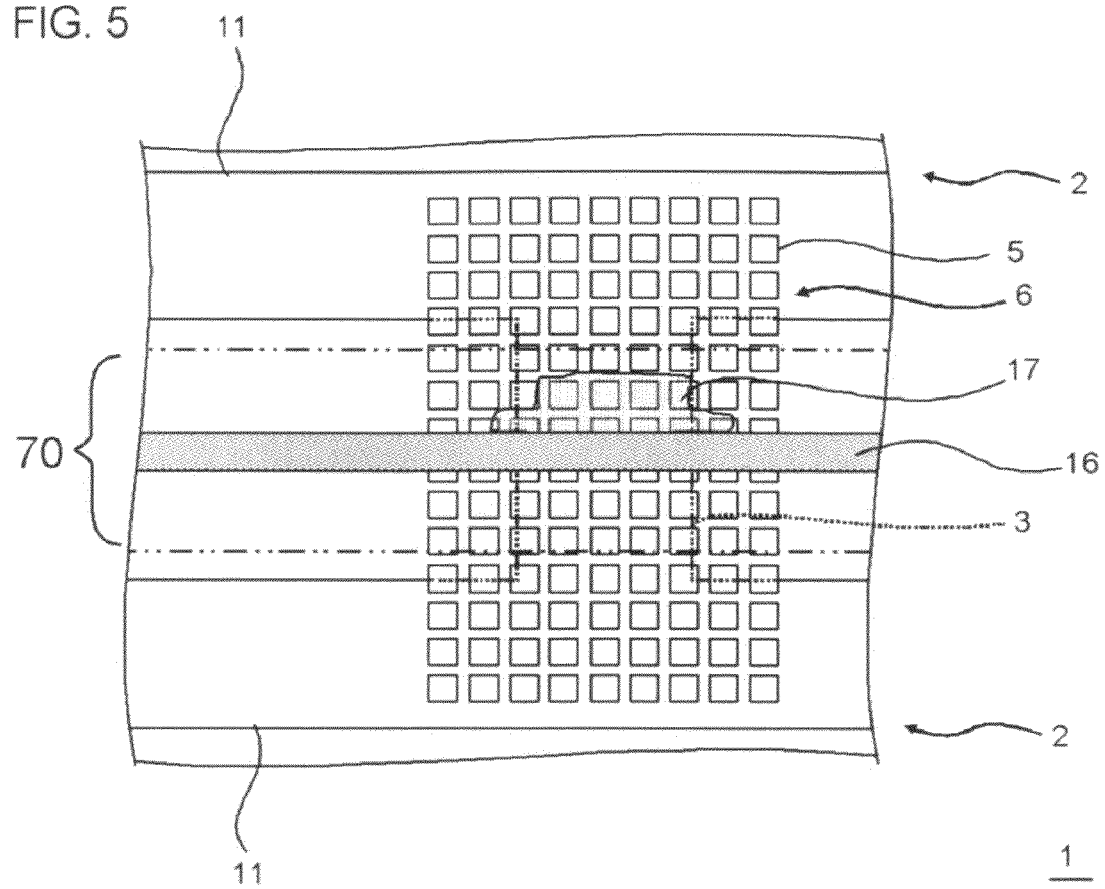
FIG. 5 is a drawing explaining operations of the first embodiment.
Figure 6:
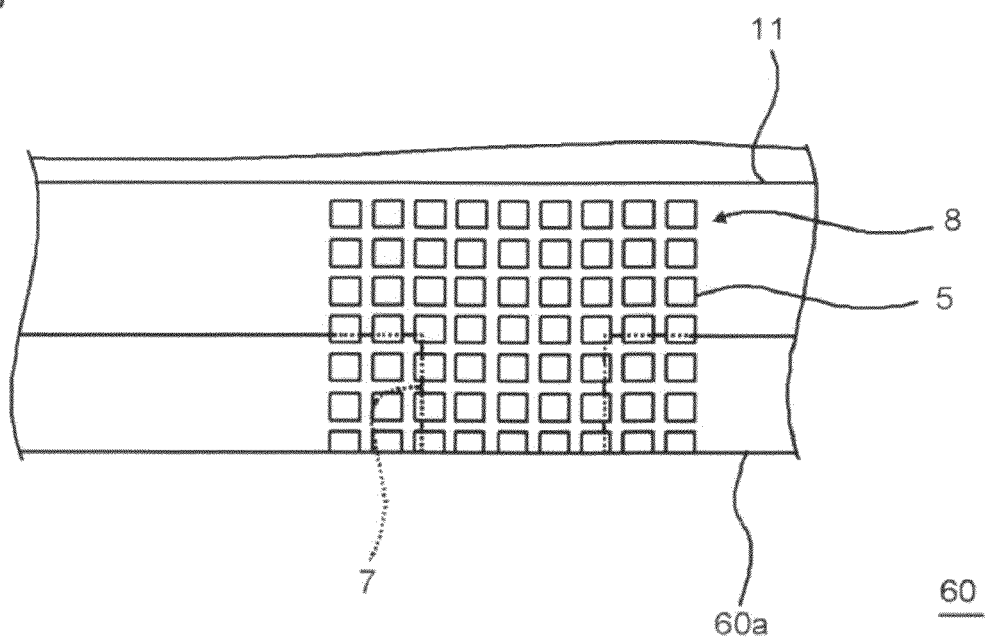
FIG. 6 is a drawing illustrating a plain structure of the end portion of a semiconductor chip according to the first embodiment.
Figure 7:
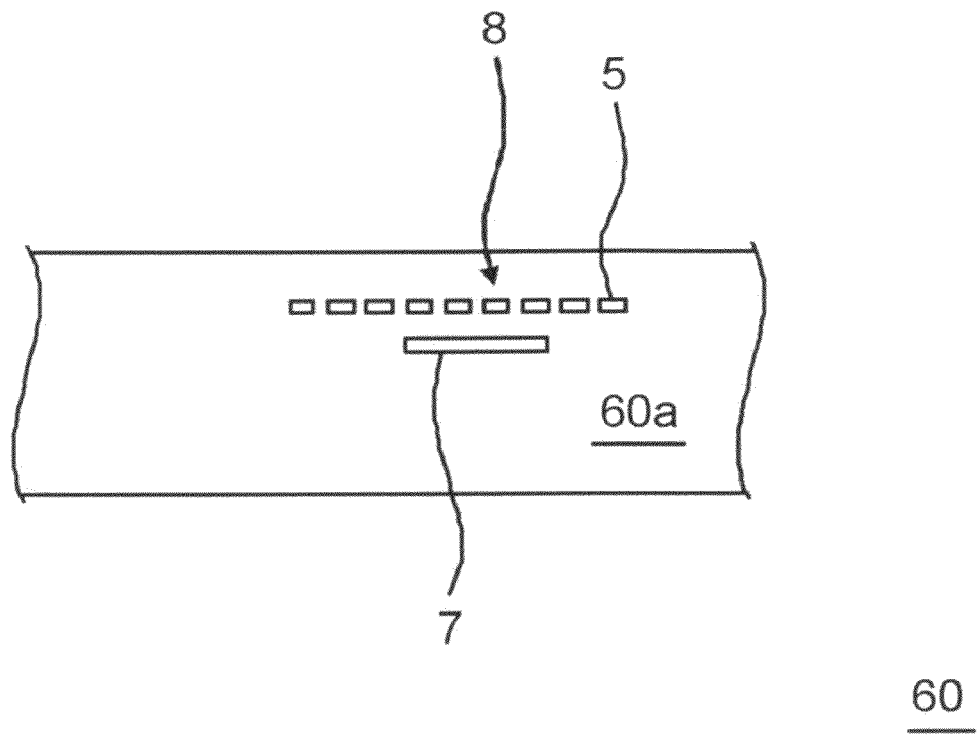
FIG. 7 is a front elevation illustrating the end face of the semiconductor chip according to the first embodiment.

FIG. 1 to FIG. 3 are drawings illustrating an essential portion of a semiconductor wafer (simply referred to as "wafer", hereinafter) 1 according to a first embodiment. FIG. 1 and FIG. 2 illustrate a plane structure of the wafer 1. FIG. 3 illustrates a sectional profile taken along line A-A in FIG. 1. FIG. 4 is a plan view of the wafer 1 according to the first embodiment, and FIG. 5 is a drawing explaining operations of the first embodiment. FIG. 6 is a drawing illustrating a plane structure of an end portion of a semiconductor chip (simply referred to as "chip", hereinafter) 60 according to the first embodiment, and FIG. 7 is a front elevation illustrating an end face 60a of a chip 60 according to the first embodiment.

A method for manufacturing a semiconductor device of this embodiment includes forming a semiconductor wafer 1 includes a plurality of interconnect layers, the semiconductor wafer 1 includes; a plurality of chip-composing portions 2; a dicing region 70 separating the chip-composing portions 2 from each other; and a plurality of inter-chip interconnects 3 electrically connecting adjacent ones of the chip-composing portions 2 and formed in one of the interconnect layers and in the dicing region 70; a dummy metal pattern 6 including a plurality of dummy metals 5, the dummy metal pattern 5 is formed in at least one of the interconnect layers over or below the inter-chip interconnects 3 only in an area corresponded to a region where the inter-chip interconnects are arranged and corresponded to a region therearound; and forming semiconductor chips 60 by dicing the dicing region 70 so as to divide the chip-composing portions 2.

The chip 60 of this embodiment has a semiconductor substrate (silicon substrate 21); and a plurality of interconnect layers (the lower interconnect layer 41 and the surficial interconnect layer 42, for example) formed over the semiconductor substrate. The chip 60 has an end portion of an interconnect 7, contained in any one of the interconnect layers (the lower interconnect layer 41, for example), exposed to the end face thereof, and has the dummy metal pattern 6 composed of a plurality of dummy metals 5, which is formed in at least one of the interconnect layers (the surficial interconnect layer 42, for example) over or below the exposed interconnect 7 only in an area corresponded to a region where the exposed interconnect 7 is arranged, and corresponded to a region therearound.

The wafer 1 of this embodiment has a plurality of interconnect layers (the lower interconnect layer 41 and the surficial interconnect layer 42, for example). The wafer 1 includes a plurality of chip-composing portions 2; a dicing region 70 separating the chip-composing portions 2 from each other; and a plurality of inter-chip interconnects 3 electrically connecting adjacent ones of the chip-composing portions 2 and formed in one of the interconnect layers and in the dicing region 70. The wafer 1 further includes a dummy metal pattern 6 including a plurality of dummy metals 5. The dummy metal pattern 6 is formed in at least one of the interconnect layers (the surficial interconnect layer 42, for example) over or below the inter-chip interconnects 3 only in an area corresponded to a region where the inter-chip interconnects 3 are arranged and corresponded to a region therearound.

First, a configuration of the wafer 1 of this embodiment will be explained.

Portion B in FIG. 4 illustrates an enlarged view of portion A of the wafer 1. As illustrated in FIG. 4, the wafer 1 of this embodiment has the plurality of chip-composing portions 2, and the inter-chip interconnects 3 which electrically connect adjacent ones of the chip-composing portions 2 sequentially with each other.

For more details, each inter-chip interconnect 3 electrically connects an interconnect 11 owned by the chip-composing portion 2, and another interconnect 11 owned by the adjacent chip-composing portion 2, as illustrated in FIG. 1. For more clear understanding of the arrangement of the inter-chip interconnects 3 illustrated in FIG. 1, a view obtained after removing the dummy metal pattern 6 from FIG. 1 is shown in FIG. 2.

As illustrated in FIG. 1 and FIG. 3, the wafer 1 has the dummy metal pattern 6 composed of the plurality of dummy metals 5. In this embodiment, typically as illustrated in FIG. 3, the dummy metal pattern 6 is formed in the surficial interconnect layer 42 which is an interconnect layer on the upper side of the inter-chip interconnects 3. The dummy metal pattern 6 is typically formed only in an layer on the upper side of the inter-chip interconnects 3. The dummy metal pattern 6 is formed so as to be spread in the in-plane direction of the wafer 1. The dummy metal pattern 6 herein is formed in the surficial interconnect layer 42, only in an area corresponded to a region where the inter-chip interconnects 3 are arranged, and corresponded to a region therearound (an arrangement area for dummy metals 39 in FIG. 3). The dummy metal pattern 6 is preferably formed, for example, only within an area not more than 50 μm away from the inter-chip interconnects 3 in the longitudinal direction of the dicing region 70. By disposing this dummy metal pattern 6, the chipping may be suppressed from spreading, even if it should occur in the process of dicing.

Each dummy metal 5 composing the dummy metal pattern 6 may typically have a rectangular plane geometry, or may alternatively have polygonal or still other plane geometry. While the dummy metal pattern 6 composed of a plurality of dummy metals, exemplified in FIG. 1 has a matrix-like arrangement, the arrangement of the dummy metals 5 in the dummy metal pattern 6 is not limited thereto. The dummy metals 5 is formed typically by using a metal such as aluminum (Al).

The inter-chip interconnect 3 and the interconnect 11 are typically provided as a power line through which source voltage is supplied. In general, the power line is made wider than signal lines. For this reason, the inter-chip interconnects 3 given as the power lines may be more likely to cause curling up in the process of dicing, as compared with those given as the signal lines.

The inter-chip interconnect 3 and interconnect 11 are typically composed of a metal such as aluminum (Al). The width of the inter-chip interconnect 3 is preferably equal to or larger than 40 μm and equal to or smaller than 80 μm, for example.

As illustrated in FIG. 3, the inter-chip interconnect 3 is formed typically in the second or deeper interconnect layer among the plurality of interconnect layers in the chip-composing portion 2, counted from the most surficial interconnect layer. In a specific case exemplified in FIG. 3, the inter-chip interconnect 3 is formed in the lower interconnect layer 41, which is the second layer counted from the topmost surficial interconnect layer 42 in the chip-composing portion 2. In general in the chip-composing portion 2, the interconnect in the level of depth more closer to the surface is made thicker. Accordingly, the dicing may further be facilitated if the inter-chip interconnect 3 is formed by the interconnect in a more deeper level.

A more detailed exemplary configuration of the wafer 1 will be explained below, referring to FIG. 3. The wafer 1 typically has a silicon substrate 21. On the silicon substrate 21, device isolation regions 22 having the STI (Shallow Trench Isolation) structure, a pMOS transistor 23, and an nMOS transistor 24 are formed.

Each of the pMOS transistor 23 and the nMOS transistor 24 has a gate insulating film 25, a gate electrode 26, extension regions 27, sidewalls 28, source-drain diffusion regions 29, and silicide layers 30 respectively formed on the gate electrode 26 and the source-drain diffusion regions 29.

The wafer 1 further has a first insulating interlayer 31 which covers the device isolation regions 22, the pMOS transistor 23 and the nMOS transistor 24; the lower interconnect layer 41 which includes the inter-chip interconnect 3; a second insulating interlayer 32 which covers the lower interconnect layer 41; the surficial interconnect layer 42 formed on the second insulating interlayer 32; and a passivation film 43. The lower interconnect layer 41 contains the interconnect 11 and interconnects 12, besides the inter-chip interconnect 3. The interconnects 12 and the silicide layers 30 formed on the source-drain diffusion regions 29 are electrically connected with each other, through contact plugs 33 provided in the first insulating interlayer 31 so as to extend therethrough. The surficial interconnect layer 42 contains the dummy metals 5 (the dummy metal pattern 6) and a surficial interconnect 13. The surficial interconnect 13 and the interconnect 12 are electrically connected with each other through a via 34 which extends through the second insulating interlayer 32.

In the wafer 1 thus configured, the region on the left from the interconnect 11 in FIG. 3 configures the chip-composing portion 2.

Next, a method for manufacturing a semiconductor device according to this embodiment will be explained.

The method for manufacturing a semiconductor device of this embodiment includes a step of manufacturing the wafer 1 configured as described in the above, and a step of dicing the wafer 1 along the dicing region 70 (FIG. 1) to separate the chip-composing portions 2 from each other, to thereby produce the chips 60. In FIG. 3, the region on the right of the boundary line 4a represents the dicing region 70.

First, the pMOS transistor 23 and the nMOS transistor 24 are fabricated on the silicon substrate 21, according to a general CMOS (Complementary Metal Oxide Semiconductor) manufacturing process. More specifically, the pMOS transistor 23 and the nMOS transistor 24 are fabricated by forming the device isolation regions 22, the gate insulating film 25, the gate electrodes 26, the extension regions 27, the sidewalls 28, the source-drain diffusion regions 29 and the silicide layers 30 on the silicon substrate 21.

Next, the first insulating interlayer 31 is formed so as to cover the device isolation regions 22, the pMOS transistor 23 and the nMOS transistor 24. Next, the contact holes 14 are formed in the first insulating interlayer 31, at positions corresponded to the source-drain diffusion regions 29, and the contact plugs 33 are formed in the contact holes 14.

Next, the lower interconnect layer 41 which contains the inter-chip interconnects 3, the interconnect 11 and the interconnects 12 are formed en bloc using a metal (Al, for example). The interconnects 12 herein are arranged so as to electrically contact with the contact plugs 33. The lower interconnect layer 41 may be formed typically by forming a metal film over the first insulating interlayer 31 and the contact plugs 33, forming thereon a mask pattern by photolithography, etching the metal film through the mask pattern, and then removing the mask pattern.

Next, the second insulating interlayer 32 is formed over the first insulating interlayer 31, so as to cover the inter-chip interconnect 3, the interconnect 11 and the interconnects 12. Next, via holes 15 are formed in the second insulating interlayer 32 at positions corresponded to the predetermined interconnects 12, and the vias 34 are then formed in the via holes 15.

Next, the surficial interconnect layer 42 which contains the surficial interconnect 13 and the dummy metals 5 (the dummy metal pattern 6) is formed en bloc over the second insulating interlayer 32, using a metal (Al, for example). The surficial interconnect layer 42 may be formed typically by forming a metal film over the second insulating interlayer 32 and the vias 34, forming thereon a mask pattern by photolithography, etching the metal film through the mask pattern, and then removing the mask pattern.

The dummy metal pattern 6 herein is formed in the surficial interconnect layer 42, which is an interconnect layer on the upper side of the inter-chip interconnect 3, so as to be spread in the in-plane direction of the wafer 1, only in an area corresponded to a region where the inter-chip interconnects 3 are arranged, and corresponded to a region therearound. The dummy metal pattern 6 is preferably formed, for example, only within an area not more than 50 μm away from the inter-chip interconnect 3 in the longitudinal direction of the dicing region 70.

Next, the passivation film 43 is formed so as to cover a part of the surficial interconnect 13 and the dummy metals 5.

By these processes, the wafer 1 is given in the state illustrated in FIG. 3. In this state, the wafer 1 has a plurality of chip-composing portions 2 formed thereon. Adjacent ones of the chip-composing portions 2 are electrically connected sequentially with each other through the inter-chip interconnect 3.

As described in the above, the inter-chip interconnect 3 and the interconnect 11 are typically given as the power line. At this stage where the chip-composing portions 2 are thus formed on the wafer 1, the chip-composing portions 2 may be inspected by supplying en bloc source voltage to the interconnects 11 of the individual chip-composing portions 2 on the wafer 1, sequentially through the inter-chip interconnects 3.

The semiconductor wafer is then diced. More specifically, the wafer 1 is diced using a dicer (not illustrated), along the dicing region 70 which extend across the inter-chip interconnects 3, between adjacent ones of the chip-composing portions 2, to thereby separate the chip-composing portions 2 from each other, to produce the chips 60.

A dicing street 16 illustrated in FIG. 5 represents a passageway of the dicing blade (not illustrated) of the dicer in the process of dicing. The dicing street 16 is typically positioned at the center portion of the dicing region 70. The wafer 1 is diced on the dicing street 16, and thereby the chip-composing portions 2 on both sides of the dicing street 16 are separated from each other. Since the dicing blade typically has a width of 20 μm to 30 μm or around, also the width of the dicing street 16 will have a width equivalent thereto.

In the process of dicing, the wafer 1 may have chipping 17 produced therein, as indicated by a hatched portion in FIG. 5. The chipping 17 is likely to be produced particularly in and around regions where the inter-chip interconnects 3 are arranged. This is because the inter-chip interconnects 3 and the constituents therearound (the first and second insulating interlayers 31, 32, for example) may be curled up (turned over), typically due to entrainment of the inter-chip interconnects 3 under the dicing blade of the dicer.

How the chipping 17 may spread, for the case where the wafer 1 has no dummy metal pattern 6 formed thereon, will be explained referring to FIG. 16.

Figure 16:
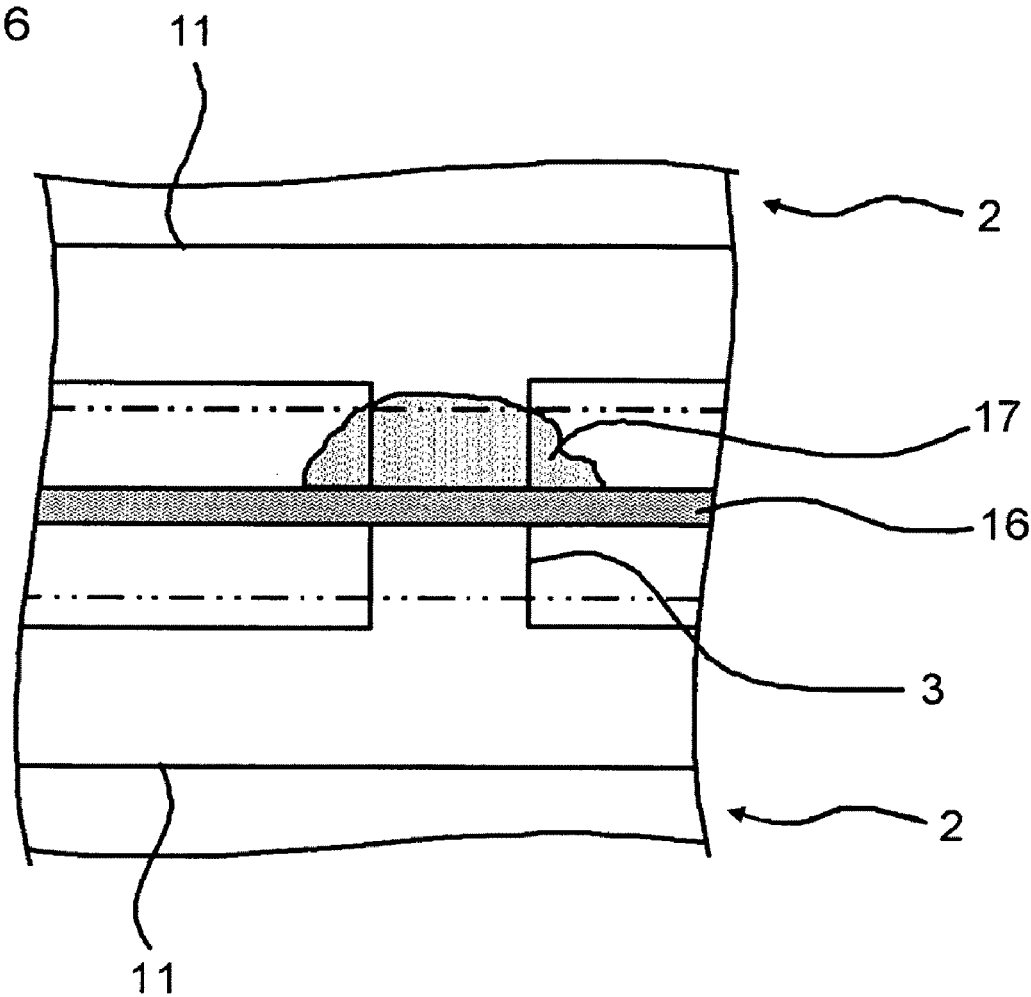
FIG. 16 is a drawing explaining operations for the case having no dummy metal pattern.

As illustrated in FIG. 16, when the wafer has no dummy metal pattern 6 formed thereon, the chipping 17 accidentally occurred in the process of dicing tends to spread over a wide area, rather than being successfully suppressed from spreading.

In contrast, according to this embodiment, the chipping 17 may successfully be suppressed from spreading as explained below, since the dummy metal pattern 6 is formed on the wafer 1.

The dummy metal pattern 6 is formed in the surficial interconnect layer 42, which is an interconnect layer on the upper side of the inter-chip interconnect 3, so as to be spread in the in-plane direction of the wafer 1, only in an area corresponded to a region where the inter-chip interconnects 3 are arranged, and corresponded to a region therearound. In other words, the dummy metal pattern 6 is disposed where the chipping is likely to occur in the process of dicing.

If the chipping 17 should occur in the process of dicing, crack induced by the chipping 17 may spread from the dicing street 16 towards the chip-composing portion 2, but the crack runs against the dummy metals 5 as illustrated in FIG. 5, which successfully prevents the chipping 17 from propagating (spreading). In this way, the chipping 17 may be suppressed from spreading.

In addition, the dummy metal pattern 6 is arranged, on the upper side of the inter-chip interconnects 3, only in areas corresponded to a region where the inter-chip interconnects 3 are arranged, and corresponded to a region therearound. Accordingly, the readiness in dicing may be prevented from degrading due to presence per se of the dummy metals 5, and thereby the wafer 1 may readily be diced, unlike the case where the dummy metal pattern 6 is formed also in the area other than the above-described areas (Japanese Laid-Open Patent Publication No. 2004-235357, for example).

As has been described in the above, both of suppression of degradation of the readiness in dicing, and suppression of spreading of chipping 17 of the wafer 1 in the process of dicing, may be achieved at the same time.

Next, a configuration of the thus-separated chip 60 obtained by the dicing will be explained, referring to FIG. 6 and FIG. 7. FIG. 6 is a drawing illustrating a plane structure of the end portion of the separated chip 60, and FIG. 7 is a schematic front elevation of the end face 60*a* of the separated chip 60.

As illustrated in FIG. 7, the end face 60*a* of the chip 60 separated by dicing has the interconnect 7 exposed therein. The interconnect 7 had been used, before the separation, as the inter-chip interconnect 3 for electrically connecting one chip-composing portion 2, later given as the chip 60, with another chip-composing portion 2 adjacent to the illustrated chip-composing portion 2.

In addition, as illustrated in FIG. 6 and FIG. 7, a dummy metal pattern 8 composed of a plurality of dummy metals 5 is formed in an interconnect layer on the upper side of the interconnect 7, so as to be spread in the in-plane direction of the chip 60, only in an area corresponded to a region where the interconnect 7 is arranged, and corresponded to a region therearound. The dummy metal pattern 8 composes a part (nearly a half) of the dummy metal pattern 6 before the wafer 1 is diced.

According to the method for manufacturing a semiconductor device of the first embodiment described in the above, the dummy metal pattern 6 composed of the plurality of dummy metals 5 is formed in at least one interconnect layer (the surficial interconnect layer 42, for example), among the plurality of interconnect layers (the lower interconnect layer 41 and the surficial interconnect layer 42), on the upper or lower side of the inter-chip interconnects 3, only in an area corresponded to a region where the inter-chip interconnects 3 are arranged, and corresponded to a region therearound. In other words, the dummy metal pattern 6 is disposed where the chipping is likely to occur in the process of dicing. Accordingly, the chipping 17 may successfully be suppressed from spreading, because the crack induced by the chipping 17 runs against the dummy metals 5, which successfully prevents the chipping 17 from propagating (spreading). In addition, the dummy metal pattern 6 is arranged, at least in one interconnect layer on the upper or lower side of the inter-chip interconnects 3, only in areas corresponded to a region where the inter-chip interconnects 3 are arranged, and corresponded to a region therearound. Accordingly, the readiness in dicing may be prevented from degrading due to presence per se of the dummy metals 5, and thereby the dicing may be facilitated, unlike the case where the dummy metal pattern 6 is formed also in the area other than the above-described areas. In short, both of suppression of degradation of the readiness in dicing, and suppression of spreading of chipping 17 in the wafer 1 in the process of dicing, may be achieved at the same time.

As judged from the appearance of the chip 60 of the first embodiment, having the interconnect 7 exposed to the end face 60a thereof, it is highly probable that the chip-composing portion 2 before the dicing (in a stage where the chip 60 was still a constituent of the wafer 1 corresponded to one chip-composing portion 2) had been electrically connected with the adjacent chip-composing portion 2 through the interconnect 7. Since the dummy metal pattern 8 was formed in at least one interconnect layer on the upper or lower side of the interconnect 7, only in an area corresponded to a region where the interconnect 7 is arranged, and corresponded to a region therearound, so that it may be said that the chipping 17 had successfully been suppressed from spreading in the process of dicing, despite the dummy metal pattern 8 was disposed at a position where the chipping 17 is likely to occur in the process of dicing. This is because the crack induced by the chipping 17 ran against the dummy metals 5, and was thereby prevented from propagating. It may also be said that, since the dummy metal pattern 8 was formed in at least one interconnect layer on the upper or lower side of the interconnect 7, only in an area corresponded to a region where the interconnect 7 is arranged, and corresponded to a region therearound, the readiness in dicing had been prevented from degrading due to presence per se of the dummy metals 5, unlike the case where the dummy metal pattern 8 was formed also in the area other than the above-described areas. In short, it may be said that both of suppression of degradation of the readiness in dicing, and suppression of spreading of chipping 17 in the wafer 1 in the process of dicing, had been achieved at the same time.

According to the semiconductor wafer 1 of the first embodiment, the dummy metal pattern 6 is formed in at least one interconnect layer on the upper or lower side of the inter-chip interconnects 3, only in an area corresponded to a region where the inter-chip interconnects 3 are arranged, and corresponded to a region therearound. In other words, the dummy metal pattern 6 is disposed where the chipping 17 is likely to occur in the process of dicing. Accordingly, the chipping 17 may successfully be suppressed from spreading in the process of dicing, because the crack induced by the chipping 17 runs against the dummy metals 5, and is thereby prevented from propagating. In addition, the dummy metal pattern 6 is arranged, at least in one interconnect layer on the upper or lower side of the inter-chip interconnects 3, only in areas corresponded to a region where the inter-chip interconnects 3 are arranged, and corresponded to a region therearound. Accordingly, the readiness in dicing may be prevented from degrading due to presence per se of the dummy metals 5, and thereby the dicing may be facilitated, unlike the case where the dummy metal pattern 6 is formed also in the area other than the above-described areas. In short, both of suppression of degradation of the readiness in dicing, and suppression of spreading of chipping 17 in the wafer 1 in the process of dicing, may be achieved at the same time.

The inter-chip interconnects 3 are typically provided as power lines, and electrically connect the interconnects 11, given as the power lines of adjacent ones of the chip-composing portions 2, with each other. In general, the power lines are made wider than signal lines. For this reason, the inter-chip interconnects 3 given as the power lines may be more likely to cause curling up in the process of dicing, as compared with those given as the signal lines, and thereby the chipping 17 may be more likely to occur. By disposing now the above-described dummy metal pattern 6 in an area corresponded to a region where the inter-chip interconnects 3 are arranged, and corresponded to a region therearound, the chipping 17 may be suppressed from spreading. In short, it may be concluded that the effect of disposing the above-described dummy metal pattern 6 may be larger for the case where the inter-chip interconnect 3 is given as a power line, as compared with the case where the inter-chip interconnect 3 is given as a signal line.

By forming the dummy metal pattern 6 only on the upper side of the inter-chip interconnects 3, it may be a natural consequence that the inter-chip interconnects 3 are disposed away from the surface of the chip-composing portions 2 (disposed in the lower portion). Since the interconnects in the chip-composing portions 2 are generally made thicker in the level of depth more closer to the surface as described in the above, so that the dicing may be facilitated for the case where the inter-chip interconnects 3 are disposed in the lower portion, and as a consequence, for the case where the inter-chip interconnects 3 are thinner than the surficial interconnect. The dicing may similarly be facilitated, also by forming the inter-chip interconnects 3 in the second or deeper interconnect layer among the plurality of interconnect layers, counted from the most surficial interconnect layer.

Figure 8:
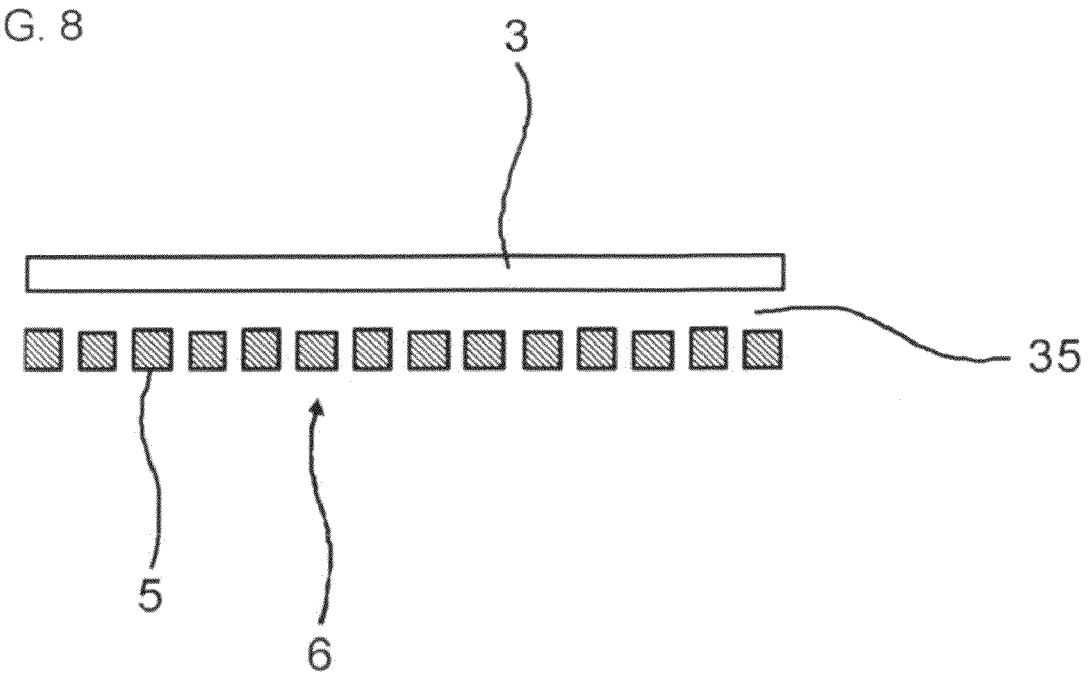
FIGS. 8 to 13 are drawings respectively illustrating essential portions of semiconductor wafers according to first to sixth modified examples.

While the first embodiment described in the above dealt with an exemplary case where the dummy metal pattern 6 is disposed on the upper side of the inter-chip interconnect 3, the dummy metal pattern 6 may alternatively be disposed on the lower side of the inter-chip interconnect 3 (while placing an insulating interlayer 35 in between), typically in a first modified example as illustrated in FIG. 8.

Figure 9:
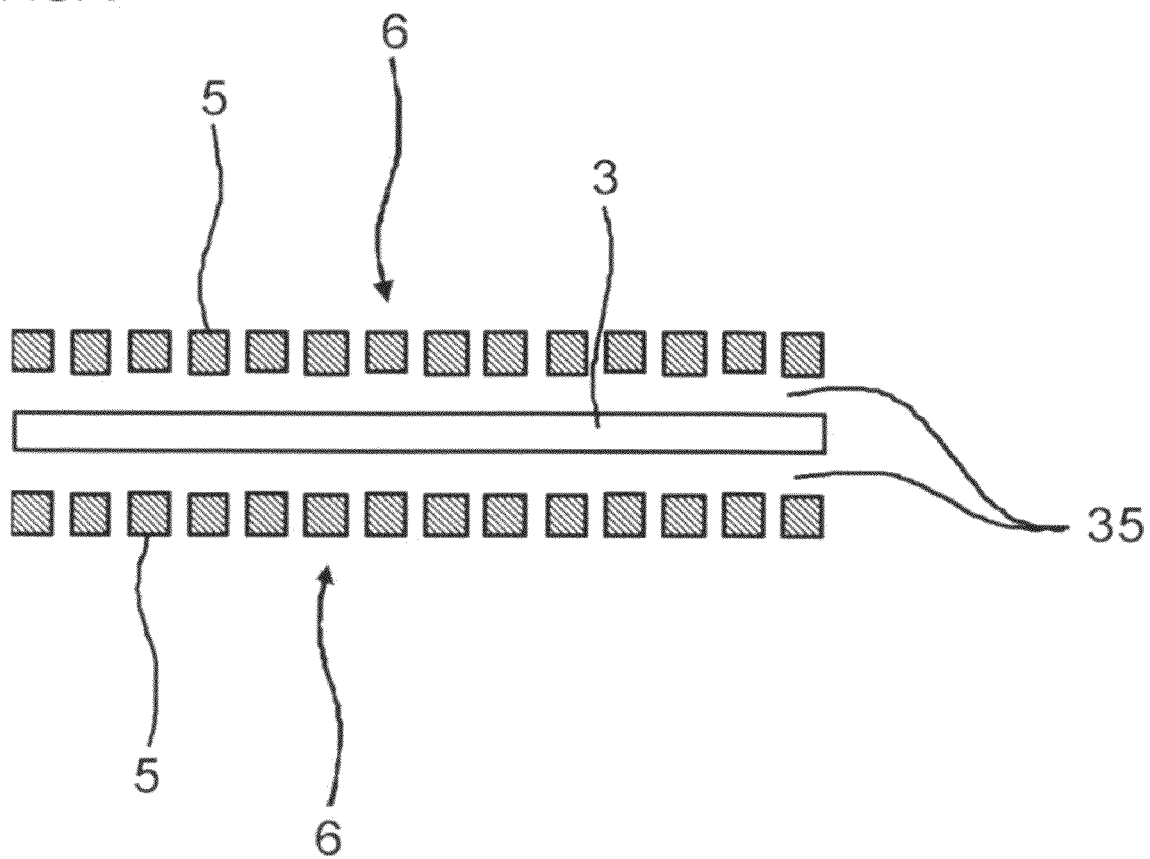

While the first embodiment described in the above dealt with an exemplary case where the dummy metal pattern 6 is disposed only on the upper side of the inter-chip interconnect 3, the dummy metal pattern 6 may alternatively be disposed respectively in the interconnect layers on the upper and lower sides of the inter-chip interconnect 3 (while respectively placing the insulating interlayer 35 in between), typically in a second modified example illustrated in FIG. 9. By forming the dummy metal patterns 6 respectively in the plurality of interconnect layers, the chipping 17 may more successfully be suppressed from spreading.

Figure 10:
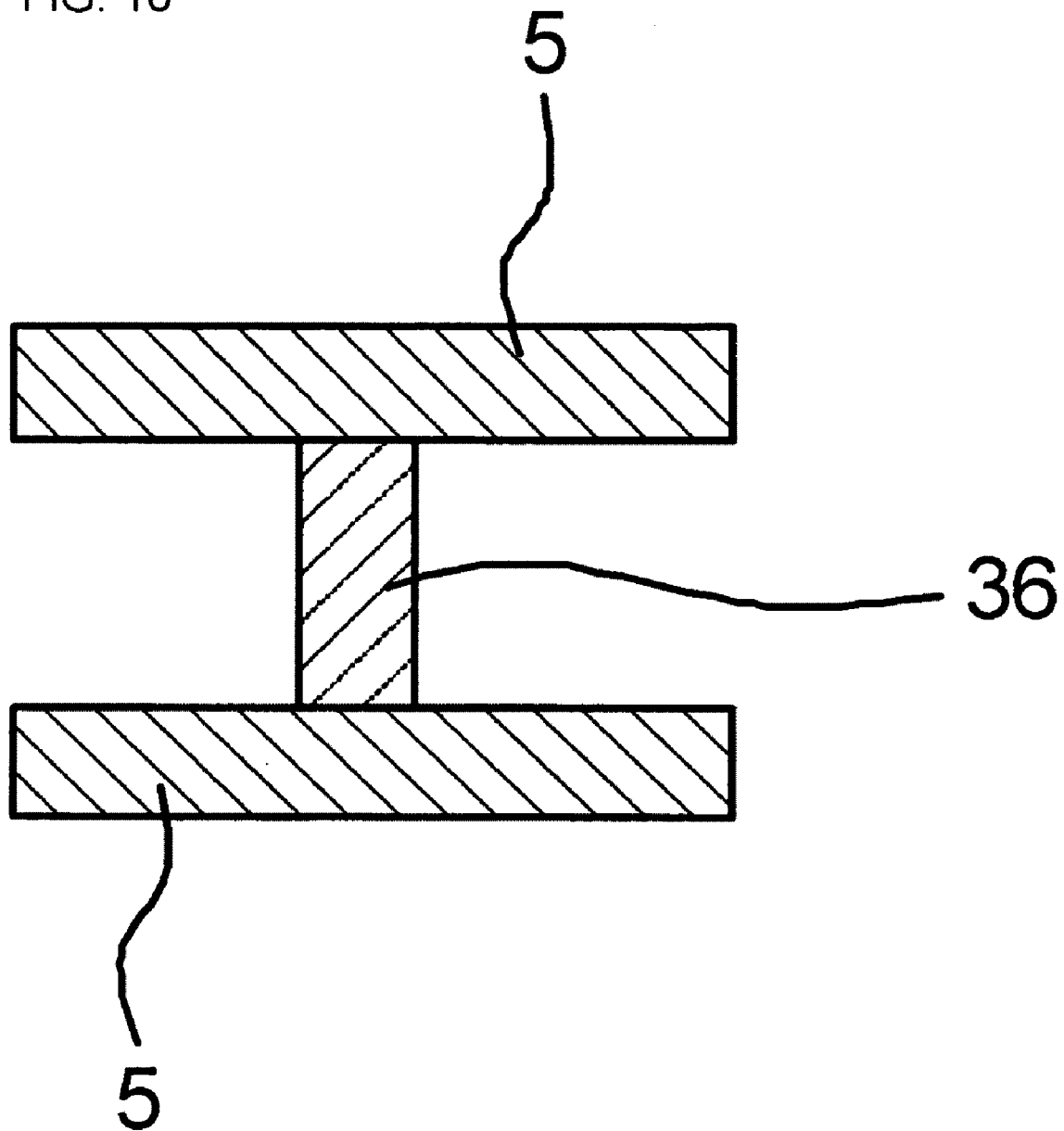

For the case where the dummy metal patterns 6 are formed respectively in the plurality of interconnect layers, the dummy metals 5 formed in the different interconnect layers may be brought into contact (may be connected) with each other through a via 36, typically in a third modified example illustrated in FIG. 10. By connecting the dummy metals 5 in the different interconnect layers with each other, the dummy metals 5 may be integrated with each other, so that the curling up in the process of dicing may be suppressed, and thereby the chipping 17 may be suppressed as a consequence.

Figure 11:
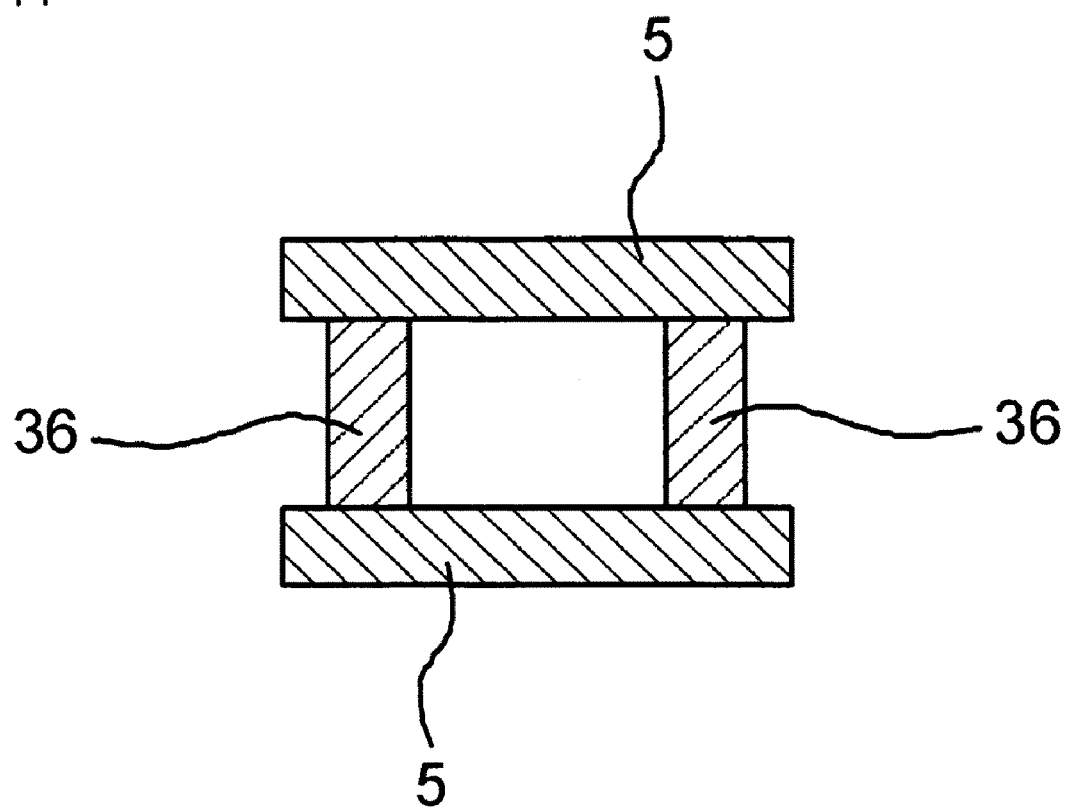

Another example of mutually connecting the dummy metals 5 formed in different interconnect layers with each other through the via 36 may be exemplified by a fourth modified example illustrated in FIG. 11, in which the dummy metals 5 formed in different interconnect layers are connected with each other at a plurality of positions through the vias 36. Since the dummy metals 5 in this case may more tightly be integrated, the curling up in the process of dicing may more effectively be suppressed, and thereby the chipping 17 may more effectively be suppressed.

Figure 12:
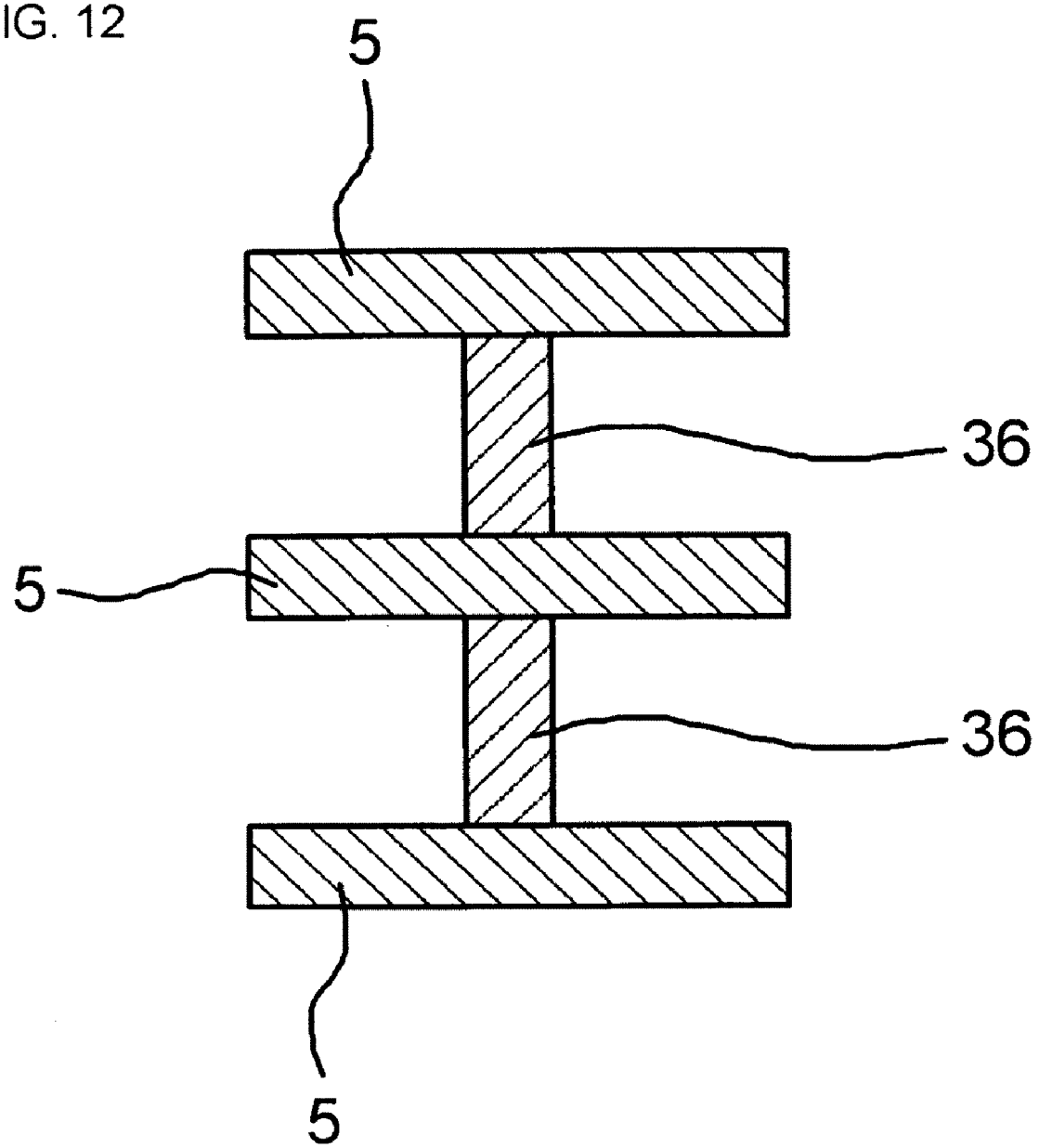
Figure 13:
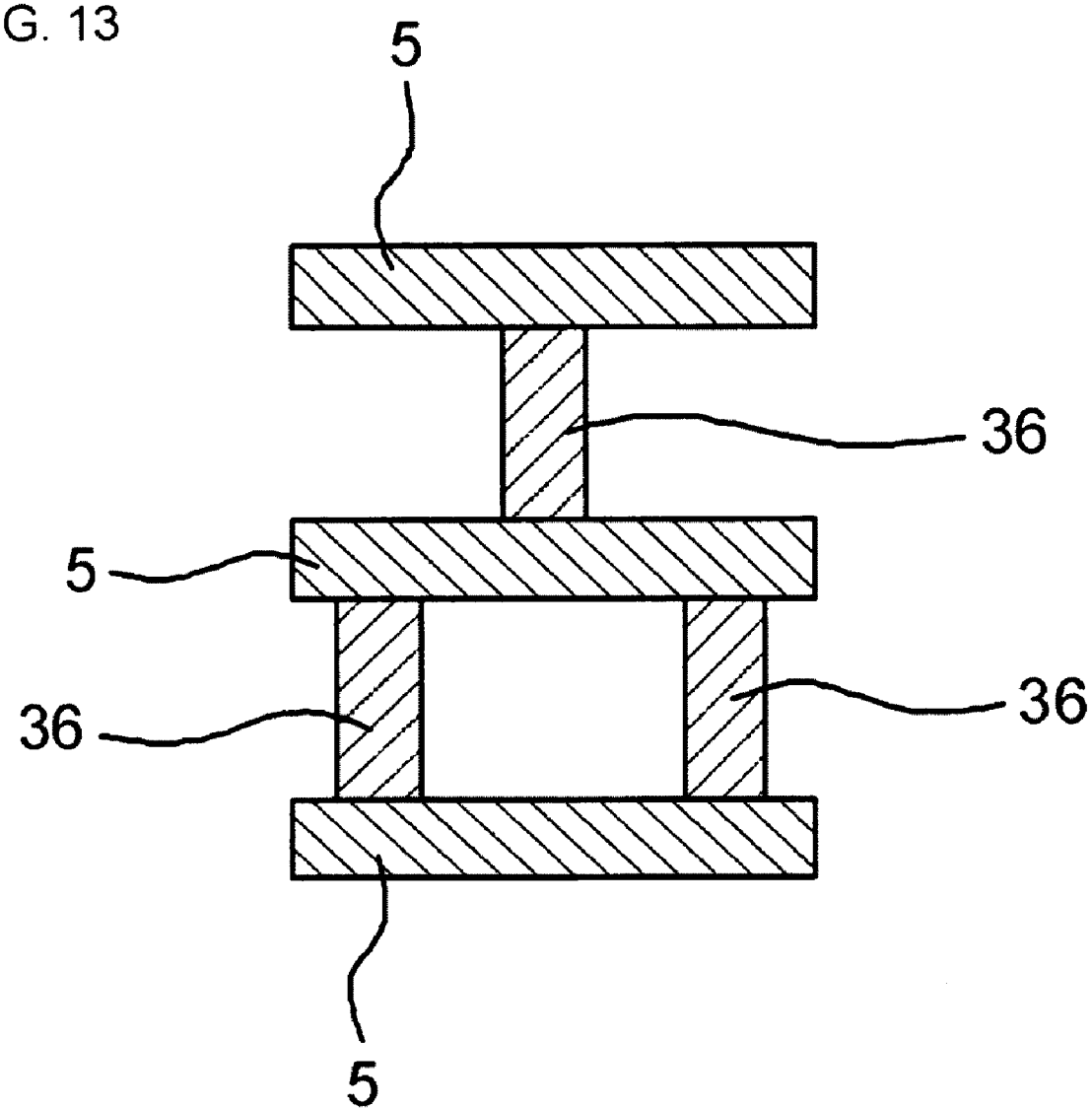

Still another example of mutually connecting the dummy metals 5 formed in different interconnect layers with each other through the vias 36 may be exemplified by a fifth modified example illustrated in FIG. 12, or a sixth modified example illustrated in FIG. 13. More specifically, the dummy metal pattern 6 (not illustrated in FIG. 12 and FIG. 13) is disposed in each of at least three interconnect layers (for example, three layers as illustrated in FIG. 12 and FIG. 13), and the dummy metals 5 formed in three or more interconnect layers may sequentially be connected through the vias 36.

Figure 14:
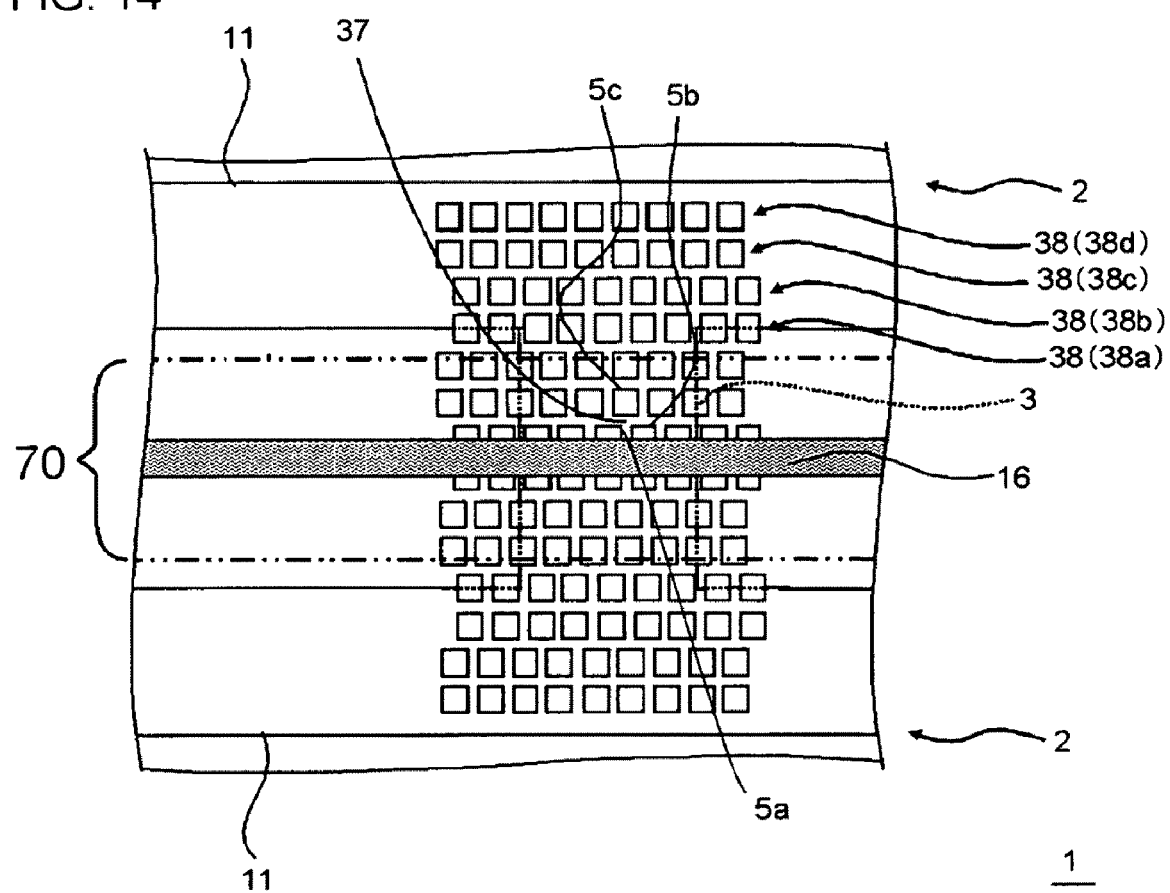
FIGS. 14 and 15 are drawings respectively illustrating plane layouts of dummy metal patterns on semiconductor wafers according to seventh and eighth modified examples.
Figure 15:
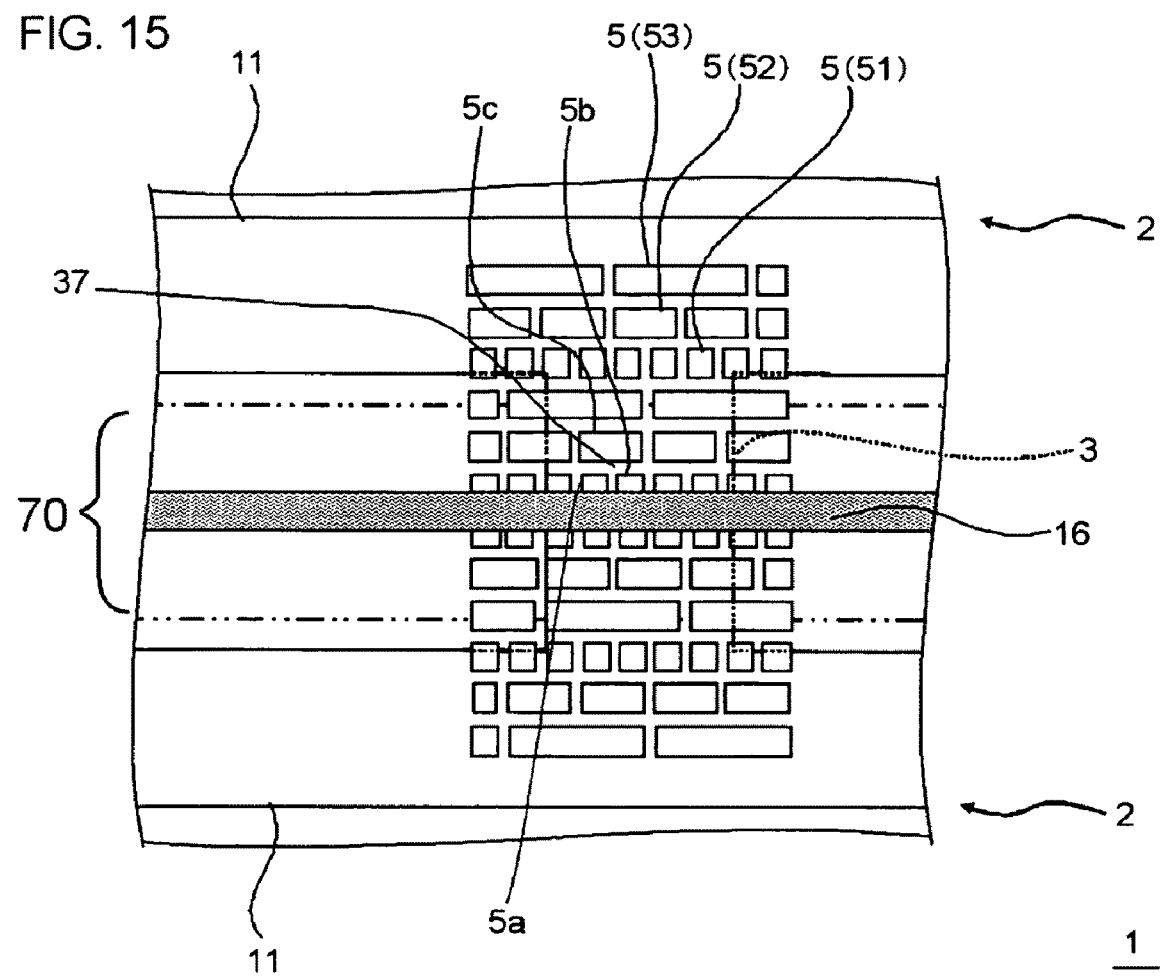

While the dummy metal pattern 6 in the above-described first embodiment was configured by arranging the dummy metals 5 to form an orthogonal matrix, the dummy metals 5 may alternatively be arranged according to a seventh modified example illustrated in FIG. 14, or may still alternatively be arranged according to an eighth modified example illustrated in FIG. 15.

In the examples illustrated in FIG. 14 and FIG. 15, the dummy metal pattern 6 is formed so that a gap 37 between first and second dummy metals 5a, 5b, which are arranged side-by-side along the dicing region 70, extends in the direction from the first and second dummy metals 5a, 5b towards a third dummy metal 5c which is arranged more closer to the chip-composing portion 2 (not illustrated in FIG. 14 and FIG. 15), so as to terminate the gap 37 such as in a T-shaped intersection. Accordingly, even if crack induced by the chipping 17 should extend along the gap 37, the crack may run against the third dummy metal 5c, so that the chipping 17 may more successfully be suppressed from spreading.

The configuration illustrated in FIG. 14 will described in more detail. The dummy metal pattern 6 contains a plurality of dummy metal rows 38 each composed of a plurality of dummy metals 5 arranged in the direction of extension of the dicing region 70, and is formed so as to stagger (hound's tooth) the dummy metal rows 38 by a plurality of rows (by two rows in the example illustrated in FIG. 14). For more details, the dummy metals 5 contained in a dummy metal row 38a, and contained in a dummy metal row 38b adjacent to the dummy metal row 38a, among the plurality of dummy metal rows 38, are arranged to form an orthogonal matrix in an area of arrangement of the dummy metal row 38a and the dummy metal row 38b. Similarly, the dummy metals 5 contained in a dummy metal row 38c adjacent to the dummy metal row 38b, and contained in a dummy metal row 38d adjacent to the dummy metal row 38c, are arranged to form an orthogonal matrix in an area of arrangement of the dummy metal row 38c and the dummy metal row 38d. Note that the dummy metals 5 contained in the dummy metal row 38a and in the dummy metal row 38b are shifted (staggered) in the position in the longitudinal direction of the dicing region 70, with respect to the dummy metals 5 contained in the dummy metal row 38c and in the dummy metal row 38d. In the example illustrated in FIG. 14, as a result of arrangement of the dummy metals 5 in this way, cracks induced by the chipping 17 between the first and the second dummy metals 5a, 5b is allowed to run against the third dummy metal 5c.

The configuration illustrated in FIG. 15 will described in more detail. The dummy metal pattern 6 contains a plurality of types (three types in an example illustrated in FIG. 15) of dummy metals 5 (dummy metals 51, 52, 53) having different length in the longitudinal direction of the dicing region 70. With respect to the length in the longitudinal direction of the dicing region 70, each dummy metal 52 is larger than each dummy metal 51, and each dummy metal 53 is larger than each dummy metal 52. More specifically, the length of each dummy metal 52 in the longitudinal direction of the dicing region 70 is set approximately twice as large as that of each dummy metal 51, and the length of each dummy metal 53 in the longitudinal direction of the dicing region 70 is set again approximately twice as large as that of each dummy metal 52. With reference to the dicing street 16, the dummy metals 52 are arranged more closer to the chip-composing portion 2 (not illustrated in FIG. 15) as compared with the dummy metals 51, and the dummy metals 53 are arranged still more closer to the chip-composing portion 2 as compared with the dummy metals 52. In the example illustrated in FIG. 15, as a result of arrangement of the dummy metals 5 in this way, cracks induced by the chipping 17 between the first and the second dummy metals 5a, 5b is allowed to run against the third dummy metal 5c.

While the foregoing paragraphs dealt with the cases where the inter-chip interconnects 3 are given as the power lines (in which the inter-chip interconnects 3 electrically connect the interconnects 11, given as the power lines, with each other), the inter-chip interconnects 3 may alternatively be given as signal lines (that is, the inter-chip interconnects 3 may electrically connect the interconnects 11, given as the signal lines, with each other). In this case, the chip-composing portions 2 may be inspected typically by supplying en bloc signals to the individual chip-composing portions 2 on the wafer 1, sequentially through the inter-chip interconnects 3, after the chip-composing portions 2 are formed on the wafer 1.

While the foregoing paragraphs dealt with the cases where the device isolation is accomplished by the device isolation regions 22 having the STI structure, the device isolation may alternatively be accomplished by the LOCOS (Local Oxidation of Silicon) process. While the foregoing paragraphs dealt with the cases where the inter-chip interconnects 3 and the dummy metals 5 are formed using Al, the inter-chip interconnects 3 and the dummy metal 5 may alternatively be formed using other metals (copper, for example).

It is apparent that the present invention is not limited to the above embodiments, that may be modified and changed without departing from the scope and spirit of the invention.

What is claimed is:

1. A method for manufacturing a semiconductor device, comprising:
   forming a semiconductor wafer comprising a plurality of interconnect layers, the semiconductor wafer including:
      a plurality of chip-composing portions;
      a dicing region separating the chip-composing portions from each other; and
      a plurality of inter-chip interconnects electrically connecting adjacent ones of the chip-composing portions and formed in one of the interconnect layers and in the dicing region;
      a dummy metal pattern comprising a plurality of dummy metals, the dummy metal pattern being formed in at least one of the interconnect layers over or below the inter-chip interconnects only in an area corresponded to a region where the inter-chip interconnects are arranged and corresponded to a region therearound; and
   forming semiconductor chips by dicing the dicing region so as to divide the chip-composing portions.

2. The method for manufacturing a semiconductor device according to claim 1,
   wherein the dummy metal pattern is formed only within an area not more than 50 μm away from the inter-chip interconnect in the longitudinal direction of the dicing region.

3. The method for manufacturing a semiconductor device according to claim 1, further comprising:
   applying source voltage to power lines of the chip-composing portions through the inter-chip interconnects, between the forming a semiconductor wafer and the forming semiconductor chips, wherein each of the inter-chip interconnects connects the power lines of adjacent ones of the chip-composing portions sequentially with each other.

4. The method for manufacturing a semiconductor device according to claim 1,
wherein the inter-chip interconnects and the dummy metals are composed of aluminum.

5. The method for manufacturing a semiconductor device according to claim 1,
wherein the dummy metal pattern is formed only in at least one of the interconnect layers over the inter-chip interconnects.

6. The method for manufacturing a semiconductor device according to claim 1,
wherein the inter-chip interconnects are formed in the second or deeper interconnect layer among the plurality of interconnect layers, counted from the most surficial interconnect layer.

7. The method for manufacturing a semiconductor device according to claim 1,
wherein the dummy metal pattern is formed in a plurality of the interconnect layers.

8. The method for manufacturing a semiconductor device according to claim 7,
wherein the dummy metals formed in different interconnect layers are connected through via(s) with each other.

9. The method for manufacturing a semiconductor device according to claim 7,
wherein the dummy metals formed in different interconnect layers are connected through vias at a plurality of positions at the dummy metals.

10. The method for manufacturing a semiconductor device according to claim 1,
wherein the dummy metal pattern is formed so that a gap between first and second dummy metals, which are arranged side-by-side along the dicing region, extends in the direction from the first and second dummy metals towards a third dummy metal which is arranged more closer to the chip-composing portion, so as to terminate the gap.

11. The method for manufacturing a semiconductor device according to claim 10,
wherein the dummy metal pattern is formed so as to contain a plurality of dummy metal rows each composed of a plurality of the dummy metals arranged in the direction of extension of the dicing region, and so as to stagger the dummy metal rows by a plurality of rows.

* * * * *